(12) United States Patent
Herron et al.

(10) Patent No.: US 8,263,973 B2
(45) Date of Patent: Sep. 11, 2012

(54) ANTHRACENE COMPOUNDS FOR LUMINESCENT APPLICATIONS

(75) Inventors: Norman Herron, Newark, DE (US); Weiying Gao, Landenberg, PA (US); Adam Fennimore, Wilmington, DE (US); Mark A. Guidry, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 315 days.

(21) Appl. No.: 12/642,116

(22) Filed: Dec. 18, 2009

(65) Prior Publication Data

US 2010/0187508 A1    Jul. 29, 2010

Related U.S. Application Data

(60) Provisional application No. 61/138,989, filed on Dec. 19, 2008.

(51) Int. Cl.
*H01L 35/24* (2006.01)

(52) U.S. Cl. ............... 257/40; 257/E51.001; 552/245; 552/251; 552/290

(58) Field of Classification Search .............. 257/40, 257/E51.001; 552/245, 251, 290
See application file for complete search history.

(56) References Cited

U.S. PATENT DOCUMENTS

| | | | |
|---|---|---|---|
| 4,053,311 A | 10/1977 | Limburg et al. |
| 5,247,190 A | 9/1993 | Friend et al. |
| 5,378,519 A | 1/1995 | Kikuchi et al. |
| 5,408,109 A | 4/1995 | Heeger et al. |
| 6,303,238 B1 | 10/2001 | Thompson et al. |
| 6,670,645 B2 | 12/2003 | Grushin et al. |
| 6,852,429 B1 | 2/2005 | Li et al. |
| 6,875,524 B2 | 4/2005 | Hatwar et al. |
| 7,075,102 B2 | 7/2006 | Grushin et al. |
| 7,173,131 B2 | 2/2007 | Saitoh et al. |
| 7,351,358 B2 | 4/2008 | Hsu et al. |
| 7,358,409 B2 | 4/2008 | Saitoh et al. |
| 7,365,230 B2 | 4/2008 | Herron et al. |
| 7,375,250 B2 | 5/2008 | Saitoh et al. |
| 7,402,681 B2 | 7/2008 | Ong et al. |
| 7,431,866 B2 | 10/2008 | Hsu et al. |
| 7,462,298 B2 | 12/2008 | Hsu et al. |
| 7,491,450 B2 | 2/2009 | Okinaka et al. |
| 7,528,542 B2 | 5/2009 | Kawamura et al. |
| 7,651,788 B2 | 1/2010 | Seo et al. |
| 7,709,104 B2 | 5/2010 | Saitoh et al. |
| 8,026,665 B2 | 9/2011 | Kim et al. |
| 2002/0076576 A1 | 6/2002 | Li et al. |
| 2003/0072966 A1 | 4/2003 | Hosokawa et al. |

(Continued)

FOREIGN PATENT DOCUMENTS

EP    443861 B1    2/1991

(Continued)

OTHER PUBLICATIONS

Gustafsson et al, "Flexible light-emitting diodes made from soluble conducting polymer," Nature vol. 357, pp. 477 479 (Jun. 11, 1992).

(Continued)

*Primary Examiner* — Anthony Ho

(57) ABSTRACT

This invention relates to anthracene derivatives that are useful in electroluminescent applications. It also relates to electronic devices in which the active layer includes such an anthracene derivative.

17 Claims, 1 Drawing Sheet

U.S. PATENT DOCUMENTS

| | | |
|---|---|---|
| 2003/0138657 A1 | 7/2003 | Li |
| 2004/0102577 A1 | 5/2004 | Hsu et al. |
| 2004/0106003 A1 | 6/2004 | Chen et al. |
| 2004/0121184 A1 | 6/2004 | Thompson et al. |
| 2004/0127637 A1 | 7/2004 | Hsu et al. |
| 2004/0209118 A1 | 10/2004 | Seo et al. |
| 2004/0263067 A1 | 12/2004 | Saitoh et al. |
| 2005/0031898 A1 | 2/2005 | Li et al. |
| 2005/0064233 A1 | 3/2005 | Matsuura et al. |
| 2005/0158577 A1 | 7/2005 | Ishibashi et al. |
| 2005/0184287 A1 | 8/2005 | Herron et al. |
| 2005/0205860 A1 | 9/2005 | Hsu et al. |
| 2005/0244670 A1 | 11/2005 | Saitoh et al. |
| 2005/0245752 A1 | 11/2005 | Conley et al. |
| 2006/0033421 A1 | 2/2006 | Matsuura et al. |
| 2006/0043858 A1 | 3/2006 | Ikeda et al. |
| 2006/0052641 A1 | 3/2006 | Funahashi |
| 2006/0103298 A1 | 5/2006 | Lee |
| 2006/0113528 A1 | 6/2006 | Okinaka et al. |
| 2006/0115678 A1 | 6/2006 | Saitoh et al. |
| 2006/0121312 A1 | 6/2006 | Yamada et al. |
| 2006/0127698 A1 | 6/2006 | Tokailin et al. |
| 2006/0152146 A1 | 7/2006 | Funahashi |
| 2006/0158102 A1 | 7/2006 | Kawamura et al. |
| 2006/0159838 A1 | 7/2006 | Kowalski et al. |
| 2006/0194074 A1 | 8/2006 | Funahashi |
| 2006/0210830 A1 | 9/2006 | Funahashi |
| 2006/0217572 A1 | 9/2006 | Kawamura et al. |
| 2006/0267488 A1 | 11/2006 | Saitoh et al. |
| 2006/0284140 A1 | 12/2006 | Breuning et al. |
| 2007/0031701 A1 | 2/2007 | Nakashima et al. |
| 2007/0063638 A1 | 3/2007 | Tokairin et al. |
| 2007/0114917 A1 | 5/2007 | Funahashi |
| 2007/0155991 A1 | 7/2007 | Funahashi |
| 2007/0236137 A1 | 10/2007 | Funahashi |
| 2007/0247063 A1 | 10/2007 | Murase et al. |
| 2007/0255076 A1 | 11/2007 | Ito et al. |
| 2007/0292713 A9 | 12/2007 | Dobbs et al. |
| 2007/0298530 A1 | 12/2007 | Feehery |
| 2008/0049413 A1 | 2/2008 | Jinde et al. |
| 2008/0071049 A1 | 3/2008 | Radu et al. |
| 2008/0086012 A1* | 4/2008 | Egawa et al. .............. 548/442 |
| 2008/0114178 A1 | 5/2008 | Kawakami et al. |
| 2008/0191614 A1 | 8/2008 | Kim et al. |
| 2008/0233433 A1 | 9/2008 | Igarashi et al. |
| 2008/0286605 A1 | 11/2008 | Takeda |
| 2008/0303425 A1 | 12/2008 | Rostovtsev et al. |
| 2008/0303428 A1 | 12/2008 | Rostovtsev et al. |
| 2008/0315754 A1 | 12/2008 | Kawamura et al. |
| 2009/0058279 A1 | 3/2009 | Takeda |
| 2009/0134781 A1 | 5/2009 | Jang et al. |
| 2011/0147718 A1 | 6/2011 | Howard, Jr. et al. |

FOREIGN PATENT DOCUMENTS

| | | |
|---|---|---|
| EP | 1061112 A1 | 12/2000 |
| EP | 765106 A2 | 11/2002 |
| EP | 1317005 A2 | 6/2003 |
| EP | 1541657 A1 | 6/2005 |
| EP | 1561794 A1 | 8/2005 |
| EP | 1612202 A1 | 1/2006 |
| EP | 2067766 A1 | 6/2009 |
| EP | 2067767 A1 | 6/2009 |
| EP | 2093271 A1 | 8/2009 |
| JP | 07249490 A | 9/1995 |
| JP | 08053397 A | 2/1996 |
| JP | 2004010550 A | 1/2004 |
| JP | 2006016384 A | 1/2006 |
| JP | 2006052323 A | 2/2006 |
| JP | 2006151844 A | 6/2006 |
| JP | 2006219392 A | 8/2006 |
| JP | 2007186449 A | 7/2007 |
| JP | 2009161470 A | 7/2009 |
| KR | 1020090046731 A | 5/2009 |
| KR | 1020090086015 A | 8/2009 |
| KR | 1020090086920 A | 8/2009 |
| KR | 1020090093897 A | 9/2009 |
| WO | 0070655 A2 | 11/2000 |
| WO | 0141512 A1 | 6/2001 |
| WO | 03008424 A1 | 1/2003 |
| WO | 03040257 A1 | 5/2003 |
| WO | 03063555 A1 | 7/2003 |
| WO | 03091688 A2 | 11/2003 |
| WO | 2004016710 A1 | 2/2004 |
| WO | 2004018587 A1 | 3/2004 |
| WO | 2005000787 A1 | 1/2005 |
| WO | 2005/052027 A1 | 6/2005 |
| WO | 2005049546 A1 | 6/2005 |
| WO | 2006025273 A1 | 3/2006 |
| WO | 2006112582 A1 | 10/2006 |
| WO | 2007021117 A1 | 2/2007 |
| WO | 2007/108666 A1 | 9/2007 |
| WO | 2007100096 A1 | 9/2007 |
| WO | 2007105917 A1 | 9/2007 |
| WO | 2008149968 A1 | 12/2008 |
| WO | 2009018009 A1 | 2/2009 |
| WO | 2009028902 A2 | 3/2009 |
| WO | 2009055628 A1 | 4/2009 |
| WO | 2009067419 A1 | 5/2009 |
| WO | 2010071362 A2 | 6/2010 |
| WO | 2010099534 A2 | 9/2010 |
| WO | 2010135403 A2 | 11/2010 |

OTHER PUBLICATIONS

Kirk-Othmer Encyclopedia of Chemical Technology, Fourth Edition, vol. 18, p. 837-860, 1996, by Y. Wang.

Markus, John, Electronics and Nucleonics dictionary, 470 and 476 (McGraw-Hill 1966) (Book Not Included).

CRC Handbook of Chemistry and Physics, 81st Edition (2000-2001) (Book Not Included).

International Search Report, PCT/US2009/069255, PCT counterpart of the present application, KIPO, Daejeon, Aug. 13, 2010.

Carey et al., Structure and Mechanisms; Advanced Organic Chemistry, Part A, 5th Edition, pp. 142-145, 2007.

Danel et al—Blue-Emitting Anthracenes With End-Capping Diaryamines,—Chem Mater 2002 vol. 14 pp. 3860-3865.

Mueller et al, Synthesis and Characterization of Soluble Oligo(9,10-anthrylene)s, K. Chem. Ber. 1994, vol. 127, pp. 437-444.

Weine et al—Reactions of an O-Quinone Monoimide With Antracenes, Phencyclone and 1,3-Diphenylisobenzofuran, Journal of Organic Chemistry 1989 vol. 54 pp. 5926-5930.

PCT International Search Report for International Application No. PCT/US2008/065189; Oct. 10, 2008.

PCT International Search Report for International Application No. PCT/US2009/068928; Aug. 17, 2010.

Beckmann et al., "Methyl Reorientation in Solid 3-ethychrysene and 3-isopropylesene; Solid State Nuclear Magnetic Resonance," 1998; vol. 12; pp. 251-256.

Kim et al., "Synthesis and Electroluminescent Properties of Highly Efficient Anthracene Derivatives with Bulky Side Groups," Organic Electronics, 2009, vol. 10, No. 5, pp. 822-833.

Klaerner et al., "Cross-Linkable Polymers Based on Dialkylfluorenes," Chemistry of Materials, 1999, 11, pp. 1800-1805.

Kodomari et al., "Selective Halogenation of Aromatic Hydrocarbons with Alumina-Supported Copper (III) Halides," Journal of Organic Chemistry,1988, vol. 53, p. 2093-2094.

Negishi et al; III.2.15 Palladium Catalyzed Conjugate Substitution; Handbook of Organopalladium Chemistry for Organic Synthesis, 2000, vol. 1, pp. 767-789.

Extended European Search Report for Application No. EP 09833870.0; Feb. 21, 2012.

International Search Report for Application No. PCT/US2011/064654, published as WO2012/082743; Jan Ziegler, Authorized Officer; EPO; May 31, 2012.

\* cited by examiner

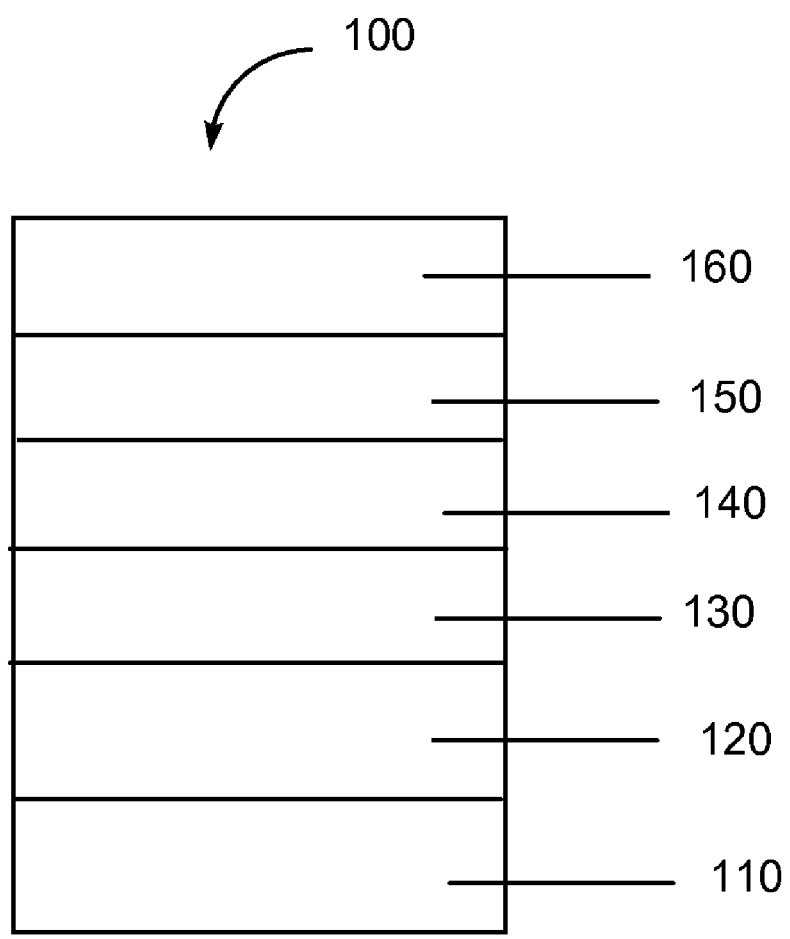

ANTHRACENE COMPOUNDS FOR LUMINESCENT APPLICATIONS

RELATED APPLICATION

This application claims priority under 35 U.S.C. §119(e) from Provisional Application No. 61/138,989 filed Dec. 19, 2008 which is incorporated by reference in its entirety.

BACKGROUND

1. Field of the Disclosure

This invention relates to electroluminescent compounds which are anthracene derivatives. It also relates to electronic devices in which the active layers include such a compound.

2. Description of the Related Art

Organic electronic devices that emit light, such as light-emitting diodes that make up displays, are present in many different kinds of electronic equipment. In all such devices, an organic active layer is sandwiched between two electrical contact layers. At least one of the electrical contact layers is light-transmitting so that light can pass through the electrical contact layer. The organic active layer emits light through the light-transmitting electrical contact layer upon application of electricity across the electrical contact layers.

It is well known to use organic electroluminescent compounds as the active component in light-emitting diodes. Simple organic molecules such as anthracene, thiadiazole derivatives, and coumarin derivatives are known to show electroluminescence. Semiconductive conjugated polymers have also been used as electroluminescent components, as has been disclosed in, for example, U.S. Pat. Nos. 5,247,190, 5,408,109, and Published European Patent Application 443 861.

However, there is a continuing need for electroluminescent compounds, especially compounds that are blue-or green-emitting.

SUMMARY

There is provided a compound having Formula I:

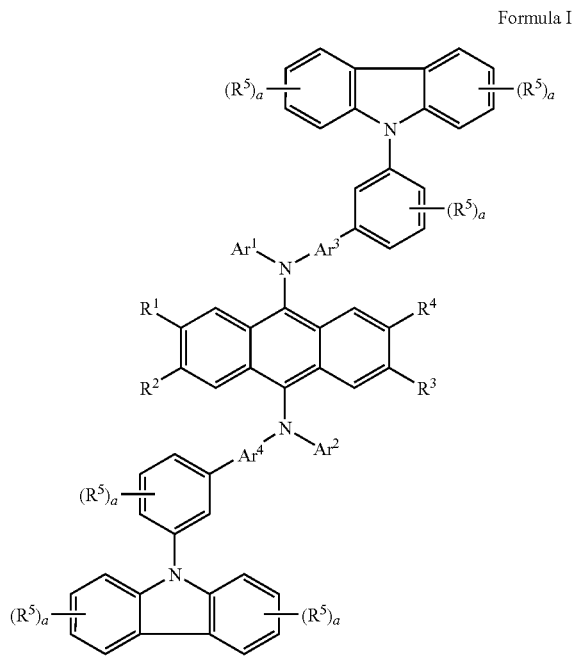

Formula I wherein:
$Ar^1$ and $Ar^2$ are the same or different and are aryl;
$Ar^3$ and $Ar^4$ are the same or different and are selected from the group consisting of a single bond and arylene; and
$R^1$ through $R^4$ are the same or different and are selected from the group consisting of H, D, alkyl, and alkoxy;
$R^5$ is the same or different at each occurrence and is selected from the group consisting of D, alkyl, alkoxy, and aryl;
a is the same or different at each occurrence and is an integer from 0-4.

There is also provided an electronic device comprising an active layer comprising a compound of Formula I.

BRIEF DESCRIPTION OF THE DRAWINGS

Embodiments are illustrated in the accompanying figures to improve understanding of concepts as presented herein.

FIG. 1 includes an illustration of one example of an organic electronic device.

Skilled artisans will appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are disclosed herein and are exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Electroluminescent Compound, the Electronic Device, and finally Examples.

1. Definitions and Clarification of Terms

Before addressing details of embodiments described below, some terms are defined or clarified.

As used herein, the term "aliphatic ring" is intended to mean a cyclic group that does not have delocalized pi electrons. In some embodiments, the aliphatic ring has no unsaturation. In some embodiments, the ring has one double or triple bond.

The term "alkoxy" refers to the group RO—, where R is an alkyl.

The term "alkyl" is intended to mean a group derived from an aliphatic hydrocarbon having one point of attachment, and includes a linear, a branched, or a cyclic group. The term is intended to include heteroalkyls. In some embodiments, an alkyl group has from 1-20 carbon atoms.

The term "aryl" is intended to mean a group derived from an aromatic hydrocarbon having one point of attachment. The term "aromatic compound" is intended to mean an organic compound comprising at least one unsaturated cyclic group having delocalized pi electrons. The term is intended to mean aromatic compounds having only carbon and hydrogen atoms. The term aryl includes groups which have a single ring and those which have multiple rings which can be joined by a single bond or fused together. The term "arylene" is intended to mean a group derived from an aromatic hydrocarbon having two points of attachment. In some embodiments, an aryl group has from 3-60 carbon atoms.

The term "branched alkyl" refers to an alkyl group having at least one secondary or tertiary carbon. The term "secondary alkyl" refers to a branched alkyl group having a secondary carbon atom. The term "tertiary alkyl" refers to a branched alkyl group having a tertiary carbon atom. In some embodiments, the branched alkyl group is attached via a secondary or tertiary carbon.

The term "compound" is intended to mean an electrically uncharged substance made up of molecules that further consist of atoms, wherein the atoms cannot be separated by physical means. The phrase "adjacent to," when used to refer to layers in a device, does not necessarily mean that one layer is immediately next to another layer. On the other hand, the phrase "adjacent R groups," is used to refer to R groups that are next to each other in a chemical formula (I.e., R groups that are on atoms joined by a bond). The term "photoactive" refers to any material that exhibits electroluminescence and/or photosensitivity.

The prefix "hetero" indicates that one or more carbon atoms have been replaced with a different atom. In some embodiments, the different atom is N, O, or S.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "organic electronic device" or sometimes just "electronic device" is intended to mean a device including one or more organic semiconductor layers or materials.

All groups can be substituted or unsubstituted unless otherwise indicated. In some embodiments, the substituents are selected from the group consisting of D, halide, alkyl, alkoxy, aryl, and cyano.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The IUPAC numbering system is used throughout, where the groups from the Periodic Table are numbered from left to right as 1-18 (CRC Handbook of Chemistry and Physics, 81$^{st}$ Edition, 2000).

2. Electroluminescent Compound

One aspect of the present invention is a compound of Formula I:

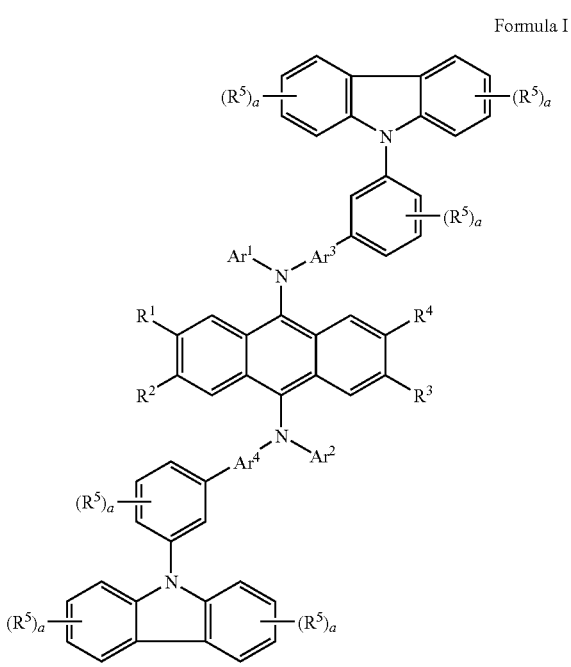

Formula I wherein:
  $Ar^1$ and $Ar^2$ are the same or different and are aryl;
  $Ar^3$ and $Ar^4$ are the same or different and are selected from the group consisting of a single bond and arylene; and
  $R^1$ through $R^4$ are the same or different and are selected from the group consisting of H, D, alkyl, and alkoxy;
  $R^5$ is the same or different at each occurrence and is selected from the group consisting of D, alkyl, alkoxy, and aryl;
  a is the same or different at each occurrence and is an integer from 0-4.

In some embodiments, the compounds are capable of blue or green emission.

In some embodiments, $Ar^1=Ar^2$. In some embodiments, $Ar^1$ and $Ar^2$ are selected from the group consisting of naphthyl, naphthylphenyl, phenylnaphthyl and a group having Formula II:

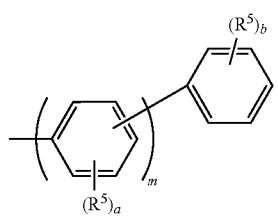

Formula II where:
  $R^5$ is the same or different at each occurrence and is selected from the group consisting of D, alkyl, alkoxy, and aryl;
  a is the same or different at each occurrence and is an integer from 0-4;
  b is the same or different at each occurrence and is an integer from 0-5; and
  m is the same or different at each occurrence and is an integer from 0 to 6.

In some embodiments, $Ar^1$ and $Ar^2$ have Formula IIa:

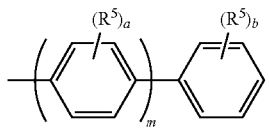

Formula IIa where $R^5$, a, b, and m are as defined above.

In some embodiments, $Ar^1$ and $Ar^2$ are selected from the group consisting of phenyl, biphenyl, terphenyl, naphthyl, phenylnapthyl, naphthylphenyl, and binaphthyl.

In some embodiments, $Ar^3$ and $Ar^4$ are selected from the group consisting of a single bond, naphthylene, naphthylphenylene, phenylnaphthylene, and a group having Formula III:

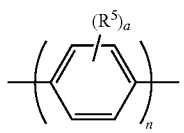

Formula III where:
- $R^5$ is the same or different at each occurrence and is selected from the group consisting of D, alkyl, alkoxy, and aryl;
- a is the same or different at each occurrence and is an integer from 0-4; and
- n is the same or different at each occurrence and is an integer from 1 to 6.

In some embodiments, $Ar^3$ and $Ar^4$ are each a single bond.

In some embodiments, $R^1=R^3$ and $R^2=R^4$. In some embodiments, $R^1$ and $R^3$ are selected from branched alkyls and cycloalkyls having 5-15 carbon atoms. In some embodiments, $R^2$ and $R^4$ are H. In some embodiments, $R^1=R^3=R^2=R^4=H$.

In some embodiments, a=0.

In some embodiments, mixtures of two or more different isomeric forms are present.

Some non-limiting examples of compounds having Formula I include Compounds E1 through E5 below:

Compound E1:

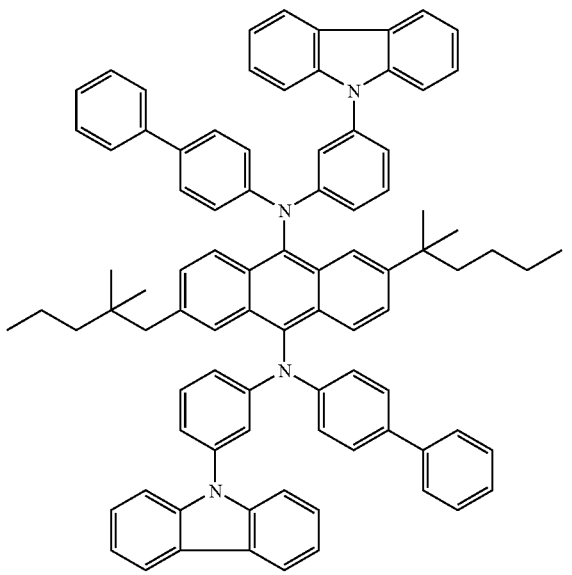

Compound E2 (isomeric mixture):

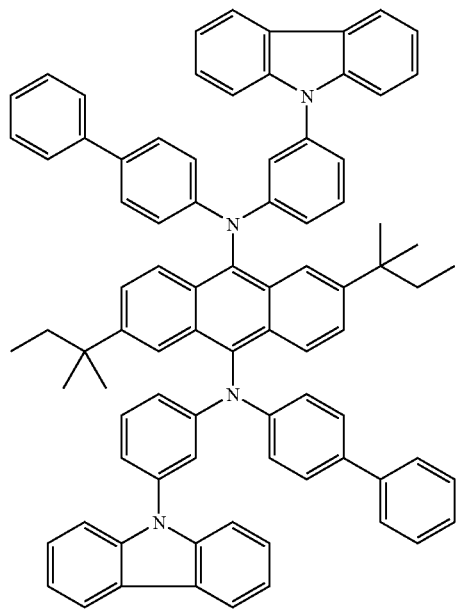

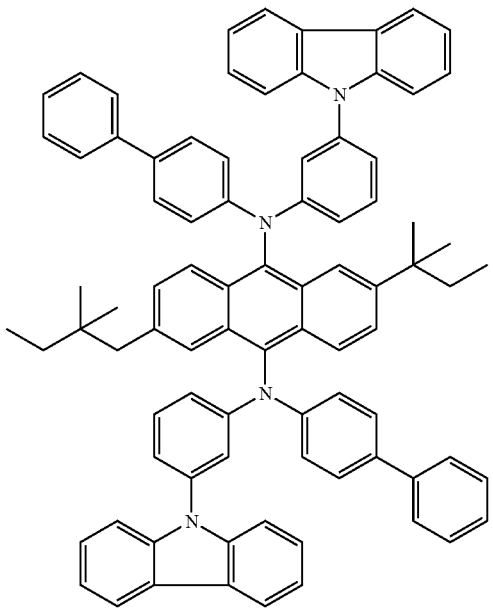

Compound E3:

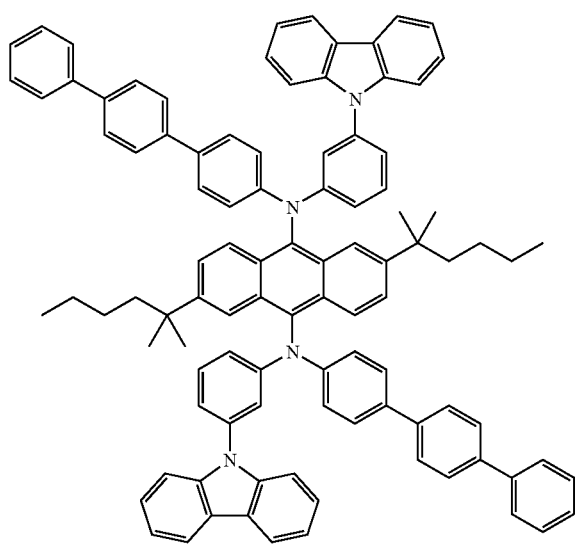

C$_{100}$H$_{86}$N$_4$
Exact Mass: 1342.69
Mol. Wt.: 1343.78
C, 89.38; H, 6.45; N, 4.17

Compound E4:

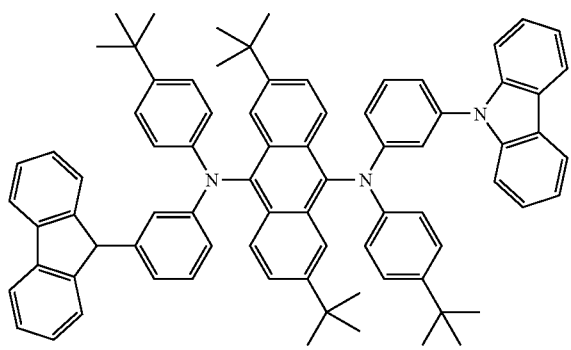

C$_{78}$H$_{74}$N$_4$
Exact Mass: 1066.59
Mol. Wt: 1067.45
C, 87.76; H, 6.99; N, 5.25

Compound E5:

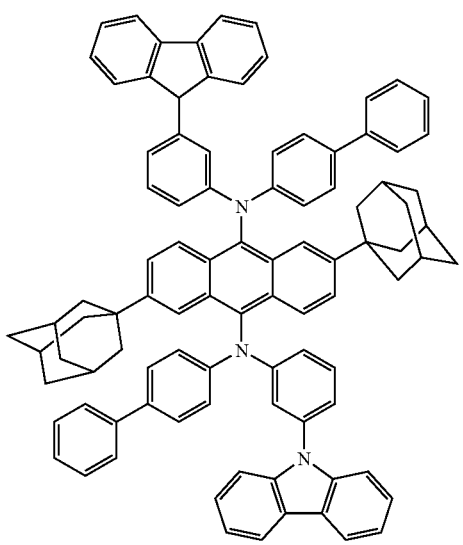

C$_{94}$H$_{78}$N$_4$
Exact Mass: 1262.62
Mol. Wt.: 1263.65
C, 89.34; H, 6.22; N, 4.43

The new compounds can be prepared by known coupling and substitution reactions. Exemplary preparations are given in the Examples.

The compounds described herein can be formed into films using liquid deposition techniques. Thin films of these materials dispersed in a host matrix exhibit good to excellent photoluminescent properties and blue or green emission.

3. Electronic Device

Organic electronic devices that may benefit from having one or more layers comprising the electroluminescent materials described herein include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a transistor or diode).

One illustration of an organic electronic device structure is shown in FIG. 1. The device 100 has a first electrical contact layer, an anode layer 110 and a second electrical contact layer, a cathode layer 160, and a photoactive layer 140 between them. Adjacent to the anode is a buffer layer 120. Adjacent to the buffer layer is a hole transport layer 130, comprising hole transport material. Adjacent to the cathode may be an electron transport layer 150, comprising an electron transport material. As an option, devices may use one or more additional hole injection or hole transport layers (not shown) next to the anode 110 and/or one or more additional electron injection or electron transport layers (not shown) next to the cathode 160.

Layers 120 through 150 are individually and collectively referred to as the active layers.

In one embodiment, the different layers have the following range of thicknesses: anode 110, 500-5000 Å, in one embodiment 1000-2000 Å; buffer layer 120, 50-2000 Å, in one embodiment 200-1000 Å; hole transport layer 130, 50-2000

Å, in one embodiment 200-1000 Å; photoactive layer 140, 10-2000 Å, in one embodiment 100-1000 Å; layer 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. The desired ratio of layer thicknesses will depend on the exact nature of the materials used.

Depending upon the application of the device 100, the photoactive layer 140 can be a light-emitting layer that is activated by an applied voltage (such as in a light-emitting diode or light-emitting electrochemical cell), or a layer of material that responds to radiant energy and generates a signal with or without an applied bias voltage (such as in a photo-detector). Examples of photodetectors include photoconductive cells, photoresistors, photoswitches, phototransistors, and phototubes, and photovoltaic cells, as these terms are described in Markus, John, *Electronics and Nucleonics Dictionary*, 470 and 476 (McGraw-Hill, Inc. 1966).

a. Photoactive Layer

The electroluminescent compounds of Formula I are useful as photoactive materials in layer 140. The compounds can be used alone, or in combination with a host material.

In some embodiments, the photoactive layer consists essentially of a host material and an electroluminescent compound having Formula I.

In some embodiments, the host is a bis-condensed cyclic aromatic compound.

In some embodiments, the host is an anthracene derivative compound. In some embodiments the compound has the formula:

An-L-An where:
An is an anthracene moiety;
L is a divalent connecting group.

In some embodiments of this formula, L is a single bond, —O—, —S—, —N(R)—, or an aromatic group. In some embodiments, An is a mono-or diphenylanthryl moiety.

In some embodiments, the host has the formula:

A-An-A where:
An is an anthracene moiety;
A is the same or different at each occurrence and is an aromatic group.

In some embodiments, the A groups are attached at the 9-and 10-positions of the anthracene moiety. In some embodiments, A is selected from the group consisting naphthyl, naphthylphenylene, and naphthylnaphthylene. In some embodiments the compound is symmetrical and in some embodiments the compound is non-symmetrical.

In some embodiments, the host has the formula:

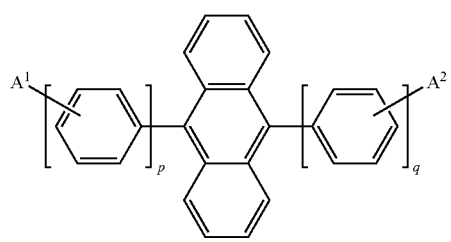

where:
$A^1$ and $A^2$ are the same or different at each occurrence and are selected from the group consisting of H, an aromatic group, an alkyl group and an alkenyl group, or A may represent one or more fused aromatic rings;

p and q are the same or different and are an integer from 1-3. In some embodiments, the anthracene derivative is non-symmetrical. In some embodiments, p=2 and q=1.

In some embodiments, at least one of $A^1$ and $A^2$ is a naphthyl group. In some embodiments, additional substituents are present.

In some embodiments, the host is selected from the group consisting of

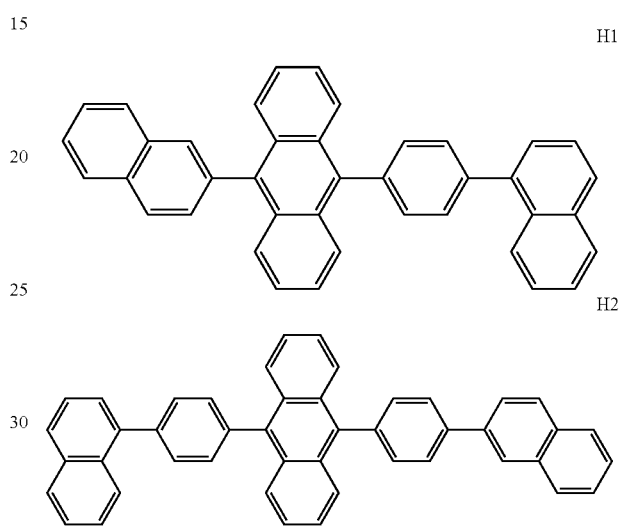

and combinations thereof.

The compounds of Formula I, in addition to being useful as emissive dopants in the photoactive layer, can also act as charge carrying hosts for other emissive dopants in the photoactive layer 140.

b. Other Device Layers

The other layers in the device can be made of any materials that are known to be useful in such layers.

The anode 110, is an electrode that is particularly efficient for injecting positive charge carriers. It can be made of, for example, materials containing a metal, mixed metal, alloy, metal oxide or mixed-metal oxide, or it can be a conducting polymer, or mixtures thereof. Suitable metals include the Group 11 metals, the metals in Groups 4-6, and the Group 8-10 transition metals. If the anode is to be light-transmitting, mixed-metal oxides of Groups 12, 13 and 14 metals, such as indium-tin-oxide, are generally used. The anode 110 can also comprise an organic material such as polyaniline as described in "Flexible light-emitting diodes made from soluble conducting polymer," *Nature* vol. 357, pp 477-479 (11 Jun. 1992). At least one of the anode and cathode is desirably at least partially transparent to allow the generated light to be observed.

The buffer layer 120 comprises buffer material and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules. They may be vapour deposited or deposited from liquids which may be in the form of solutions, dispersions, suspensions, emulsions, colloidal mixtures, or other compositions.

The buffer layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like.

The buffer layer can comprise charge transfer compounds, and the like, such as copper phthalocyanine and the tetrathiafulvalene-tetracyanoquinodimethane system (TTF-TCNQ).

In some embodiments, the buffer layer comprises at least one electrically conductive polymer and at least one fluorinated acid polymer. Such materials have been described in, for example, published U.S. patent applications 2004-0102577, 2004-0127637, and 2005/205860

Examples of hole transport materials for layer 130 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino) phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino) benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino) styryl]-5-[p-(diethylamino)phenyl]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), N,N'-bis(naphthalen-1-yl)-N,N'-bis-(phenyl)benzidine (α-NPB), and porphyrinic compounds, such as copper phthalocyanine. Commonly used hole transporting polymers are polyvinylcarbazole, (phenylmethyl)-polysilane, and polyaniline. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

Examples of additional electron transport materials which can be used in layer 150 include metal chelated oxinoid compounds, such as tris(8-hydroxyquinolato)aluminum (Alq$_3$); bis(2-methyl-8-quinolinolato)(para-phenyl-phenolato)aluminum(III) (BAlQ); and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ), and 1,3,5-tri(phenyl-2-benzimidazole) benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and mixtures thereof. The electron-transport layer may also be doped with n-dopants, such as Cs or other alkali metals. Layer 150 can function both to facilitate electron transport, and also serve as a buffer layer or confinement layer to prevent quenching of the exciton at layer interfaces. Preferably, this layer promotes electron mobility and reduces exciton quenching.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li- or Cs-containing organometallic compounds, LiF, CsF, and Li$_2$O can also be deposited between the organic layer and the cathode layer to lower the operating voltage.

It is known to have other layers in organic electronic devices. For example, there can be a layer (not shown) between the anode 110 and buffer layer 120 to control the amount of positive charge injected and/or to provide bandgap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device can be prepared by a variety of techniques, including sequential vapor deposition of the individual layers on a suitable substrate. Substrates such as glass, plastics, and metals can be used. Conventional vapor deposition techniques can be used, such as thermal evaporation, chemical vapor deposition, and the like. Alternatively, the organic layers can be applied from solutions or dispersions in suitable solvents, using conventional coating or printing techniques, including but not limited to spin-coating, dip-coating, roll-to-roll techniques, ink-jet printing, screen-printing, gravure printing and the like.

The present invention also relates to an electronic device comprising at least one active layer positioned between two electrical contact layers, wherein the at least one active layer of the device includes the chrysene compound of Formula 1. Devices frequently have additional hole transport and electron transport layers.

To achieve a high efficiency LED, the HOMO (highest occupied molecular orbital) of the hole transport material desirably aligns with the work function of the anode, and the LUMO (lowest un-occupied molecular orbital) of the electron transport material desirably aligns with the work function of the cathode. Chemical compatibility and sublimation temperature of the materials are also important considerations in selecting the electron and hole transport materials.

It is understood that the efficiency of devices made with the chrysene compounds described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

The compounds of the invention often are fluorescent and photoluminescent and can be useful in applications other than OLEDs, such as oxygen sensitive indicators and as fluorescent indicators in bioassays.

EXAMPLES

The following examples illustrate certain features and advantages of the present invention. They are intended to be illustrative of the invention, but not limiting. All percentages are by weight, unless otherwise indicated.

Example 1

This example illustrates the preparation of Compound E1.

1A: Preparation of 2,6-and 2,7-di-(2-methyl-2-hexyl)-9,10-dibromoanthracene

Take 35 g (300 mM) 2-methyl-2-hexanol and 17.8 g anthracene (100 mM) with 50 mL trifluoroacetic acid and reflux under nitrogen overnight. The solution quickly darkens to a brown color with floating thick white oily material. Cool to room temp., evaporate under a nitrogen stream and extract into methylene chloride. Separate and dry the organic layer over anhydrous magnesium sulfate and evaporate to dryness. Extract the resulting solid through a silica column with hexanes and recover a pale yellow solution. Evaporate to a thick yellow oil and recrystallize from acetone/methanol by slow cooling to generate an off white crystalline solid

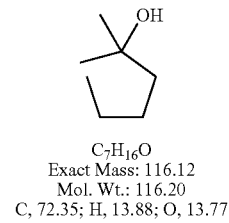

$C_7H_{16}O$
Exact Mass: 116.12
Mol. Wt.: 116.20
C, 72.35; H, 13.88; O, 13.77

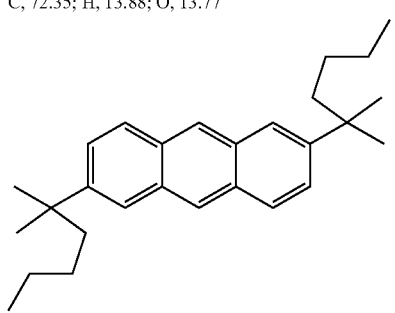

$C_{28}H_{38}$
Exact Mass: 374.30
Mol. Wt.: 374.60
C, 89.78; H, 10.22

NMR in dichloromethane is consistent with the desired product. Recrystallize again from methanol/acetone. There is a trace of the 2,7-dihexylated product present and the mother liquor from recrystallizations is enriched in this product. The 2,6 isomer material is a low melting solid and very soluble in hexanes.

Take 6.0 g (16 mM) of the pure 2,6-di-2-methylhexyl-anthracene into 100 mL dichloroethane and add 2.10 mL bromine (40 mM) dropwise with stirring at room temperature over 4 hrs. Stir for 4 hours then pour into water and add sodium sulfite to consume remaining bromine. Extract into methylene chloride and dry the organic layer over anhydrous magnesium sulfate. Run the resulting material through an alumina column with methylene chloride eluent and then evaporate and add methanol to ppt a pale yellow solid. Yield ~7.2 g

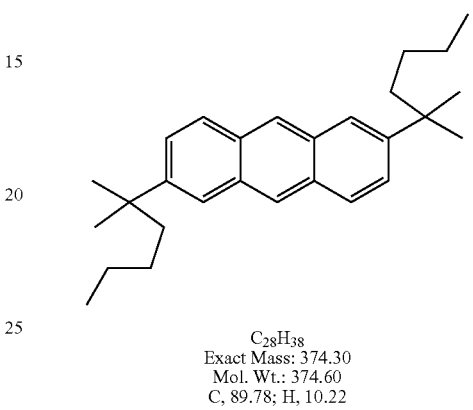

$C_{28}H_{38}$
Exact Mass: 374.30
Mol. Wt.: 374.60
C, 89.78; H, 10.22

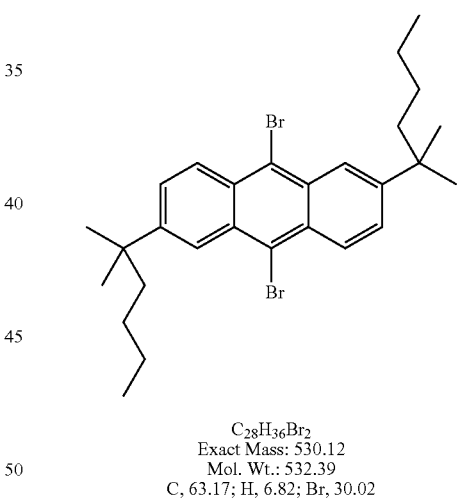

$C_{28}H_{36}Br_2$
Exact Mass: 530.12
Mol. Wt.: 532.39
C, 63.17; H, 6.82; Br, 30.02

The NMR spectrum in chloroform is consistent with the desired dibromide with a trace of the 2,7 isomer carried over from the starting anthracene.

1B: Preparation of N-4-biphenyl, N-3-(9-carbazolyl)phenylamine

Take 3.4 g of the 4-biphenylamine (0.02M) in glove box and add 6.5 g 9-(3-bromophenyl)-carbazole (0.02M). Add 0.2 g Pd2 DBA3 (0.216 mM), 0.088 g P(t-Bu)3 (0.432 mM) and 2.0 g t-BuONa and dissolve all into 25 mL toluene. Upon addition of catalyst materials, there is a mild exotherm. Heat in glove box in mantle

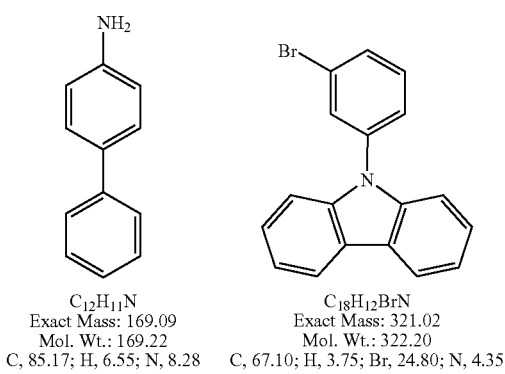

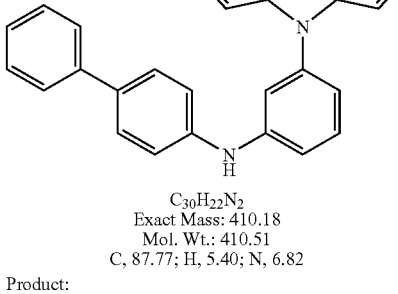

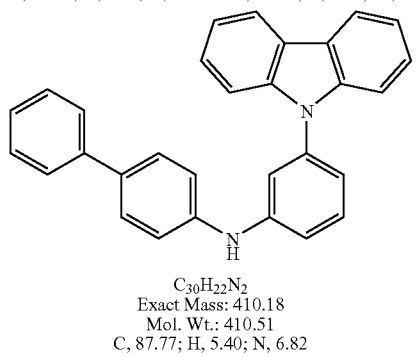

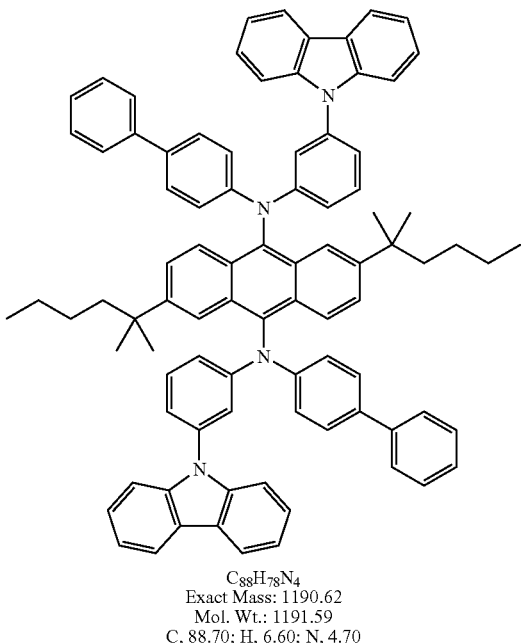

at 80° C. under nitrogen for 1 hr as a dark brown solution (thick). Cool and work up by silica chromatography eluting with toluene and collect pale brown solution with bright purple/blue PL. Evap in nitrogen to low volume and add methanol and acetone which crystallizes an off-white material. The material is a low melting crystalline solid when dry. Collect ~8 g. NMR analysis confirms the expected structure 1C: Preparation of compound E1

Take 2.65 g of 2,6-di-2-methylhexyl-9,10-dibromoanthracene (5 mM) in glove box and add 4.15 g (10 mM) N-4-biphenyl, N-3-(9-carbazolyl)-phenyl-amine and 1.0 g t-BuONa (10 mM) with 100 mL toluene. Add 0.4 g Pd2 DBA3 (0.4 mM), 0.17 g P(t-Bu)3 (0.8 mM) dissolved in 10 mL toluene. When all mixed the solution slowly exotherms and becomes yellow brown. Mix and heat in glove box in mantle at 80° C. under nitrogen for 1 hr. Solution immediately is dark purple but on reaching ~80° C. it is dark yellow green with noticeable green luminescence. Stir overnight at room temp. Cool and work up by removing from glove box and filter through a silica plug eluting with methylene chloride.

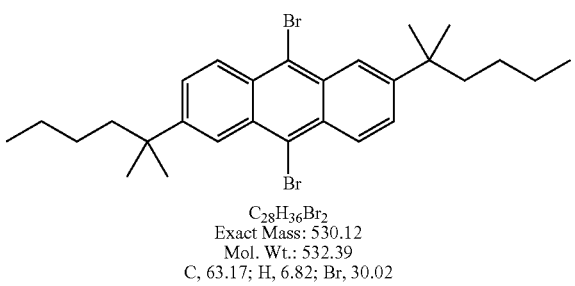

Ran through an acidic alumina chromatography column (using dichloromethane as eluent) and collect ~0.6 g of yellow crystalline solid by evaporation and addition of acetone/methanol. Redissolve in toluene and run through silica eluting with 50% hexanes/toluene and then again through basic alumina using same eluent as final clean ups. Resulting material is very soluble and NMR is consistent with the expected product.

Example 2

This example illustrates the preparation of Compound E2
The dialkyl-dibromoanthracene was prepared as in example 1A but using 2-methyl-2-butanol in place of 2-methyl-2-hexanol and was isolated as a mixture of the 2,6 and 2,7 dialkylated materials. In a nitrogen filled glove box 0.477 g of this mixture (1 mM) was added to 0.85 g (2 mM) N-4-biphenyl, N-3-(9-carbazolyl)-phenyl-amine (Ex. 1B) and 0.2 g t-BuONa (2 mM) with 10 mL mixed xylenes. Add 0.1 g Pd2 DBA3 (0.1 mM), 0.04 g P(t-Bu)$_3$ (0.2 mM) dissolved in 10 mL xylene. When all mixed, the solution slowly exotherms and becomes yellow brown. Mix and heat in glove box in mantle at 110° C. under nitrogen for 1 hr. Solution immediately is dark purple but on reaching ~80° C. it is dark yellow green with noticeable green luminescence. Stir overnight at room temp. Cool and work up by removing from glove box and filter through a silica plug eluting with methylene chloride.

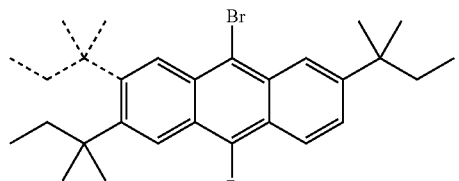

C$_{24}$H$_{28}$Br$_2$
Exact Mass: 474.06
Mol. Wt.: 476.29
C, 60.52; H, 5.93; Br, 33.55

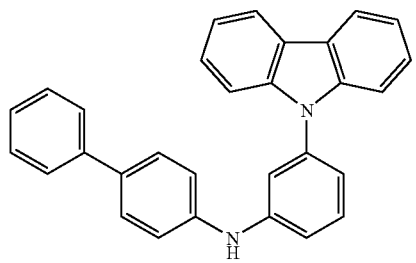

C$_{30}$H$_{22}$N$_2$
Exact Mass: 410.18
Mol. Wt.: 410.51
C, 87.77; H, 5.40; N, 6.82

Product:

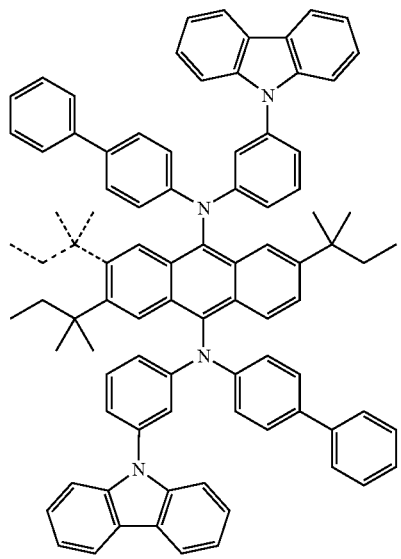

C$_{84}$H$_{70}$N$_4$
Exact Mass: 1134.56
Mol. Wt.: 1135.48
C, 88.85; H, 6.21; N, 4.93

The product was run through an alumina column (using dichloromethane) and ~0.1 g product was collected as a yellow glassy solid by evaporation and addition of acetone/methanol. Redissolve in toluene and run on acidic alumina to isolate the slowest running green photoluminescent band. The isolated solid was sent for nmr which confirms the expected product as a mix of 2,6 and 2,7 isomers and anthracene-C—N bond rotamers Example 3

This example illustrates the preparation of Compound E3

Take 0.53 g of the 2,6-di-2-methyl-2-hexyl-9,10-dibromoanthracene (1 mM) (example 1A) in a nitrogen filled glove box and add 1.0 g (2.1 mM) N-4-p-terphenyl, N-3-(9-carbazolyl)-phenyl-amine (prepared as in example 1B except using 4-p-terphenylamine in place of 4-biphenylamine) and 0.22 g t-BuONa (2.2 mM) with 30 mL toluene. Add 0.2 g Pd2 DBA3 (0.2 mM), and 0.09 g P(t-Bu)3 (0.4 mM) dissolved in 10 mL toluene. When all mixed the solution slowly exotherms and becomes yellow brown. Mix and heat in glove box in mantle at 80° C. under nitrogen for 1 hr. Solution immediately is dark purple but on reaching ~80° C. it is dark yellow green with a noticeable green luminescence. Stir 4 hrs at 80° C. Cool and work up by removing from glove box and filter through silica/celite plug eluting with toluene/methylene chloride.

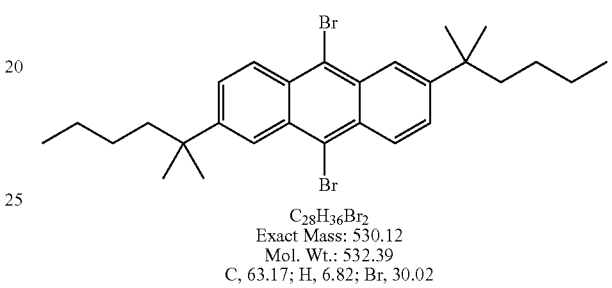

C$_{28}$H$_{36}$Br$_2$
Exact Mass: 530.12
Mol. Wt.: 532.39
C, 63.17; H, 6.82; Br, 30.02

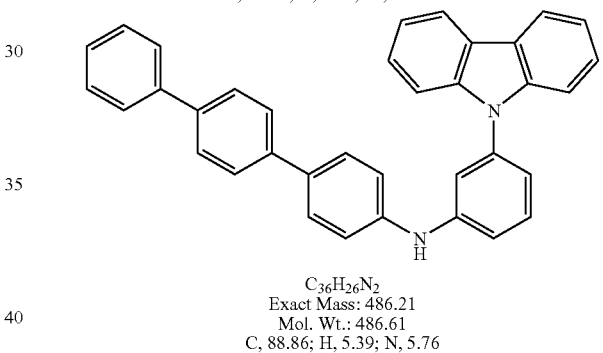

C$_{36}$H$_{26}$N$_2$
Exact Mass: 486.21
Mol. Wt.: 486.61
C, 88.86; H, 5.39; N, 5.76

Product:

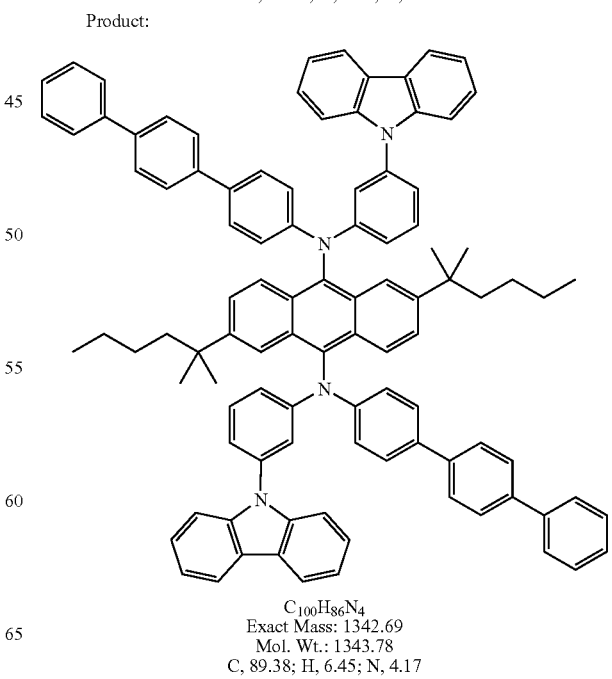

C$_{100}$H$_{86}$N$_4$
Exact Mass: 1342.69
Mol. Wt.: 1343.78
C, 89.38; H, 6.45; N, 4.17

Ran through silica/basic-alumina/florisil column (using dichloromethane and toluene) and collect ~1.1 g of yellow crystalline solid by evaporation and addition of acetone/methanol. Resulting material is very soluble in dichloromethane and modestly soluble in toluene. NMRr in dichloromethane confirms the expected structure although the molecule appears to have very restricted rotation around the anthracene-C—N bonds resulting in rotamers on the NMR timescale.

Example 4

This example illustrates the preparation of Compound E4

Take 0.45 g of the 2,6-di-t-butyl-9,10-dibromoanthracene (1 mM) (prepared as in example 1A above using t-butanol in place of 2-methyl-2-hexanol) in glove box and add 0.8 g (2 mM) 4-t-butylphenyl, N-4-t-butyl-phenyl, N-3-(9-carbazolyl)-phenyl-amine (prepared as in example 1B using 4-t-butylamine in place of 4-biphenylamine) and 0.2 g t-BuONa (2 mM) with 40 mL toluene. Add 0.15 g Pd2 DBA3 (0.15 mM), and 0.07 g P(t-Bu)$_3$ (0.3 mM) dissolved in 10 mL toluene. When all mixed the solution slowly exotherms and becomes yellow brown. Mix and heat in glove box in mantle at 80° C. under nitrogen for 1 hr. Solution immediately is dark purple but on reaching ~80° C. it is dark yellow green with a noticeable green luminescence. Cool and work up by removing from glove box and filter through a basic alumina plug eluting with toluene.

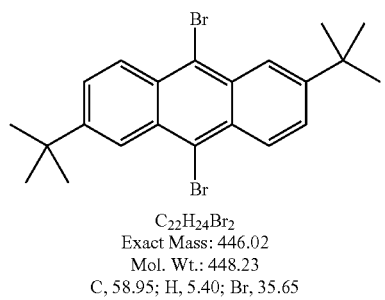

$C_{22}H_{24}Br_2$
Exact Mass: 446.02
Mol. Wt.: 448.23
C, 58.95; H, 5.40; Br, 35.65

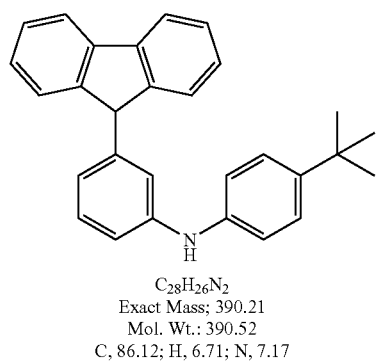

$C_{28}H_{26}N_2$
Exact Mass; 390.21
Mol. Wt.: 390.52
C, 86.12; H, 6.71; N, 7.17

-continued

Product:

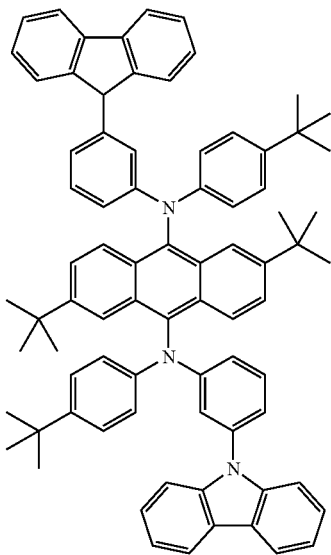

$C_{78}H_{74}N_4$
Exact Mass: 1066.59
Mol. Wt.: 1067.45
C, 87.76; H, 6.99: N, 5.25

The resulting toluene solution was bright yellow and was then run through a florisil* column using toluene eluent and collect ~0.9 g of bright yellow crystalline solid by evaporation and addition of methanol. Nmr in dichloromethane confirms the expected structure. The material is very soluble and appears to be a bluish green in solution PL. NMR indicates some restricted rotation around the anthracene-C—N bonds leading to rotamers on the NMR timescale.

Example 5

This example illustrates the preparation of Compound E5.

Take 0.94 g of the 2,6-(1-adamantyl)-9,10-dibromoanthracene (1.5 mM) (prepared as in example 1A except using 1-adamantanol in place of 2-methyl-2-hexanol) in glove box and add 1.25 g (3.1 mM) N-4-biphenyl, N-3-(9-carbazolyl)-phenyl-amine (Ex. 1B) and 0.32 g t-BuONa (3.3 mM) with 10 mL toluene. Add 0.15 g Pd2 DBA3 (0.15 mM), 0.06 g P(t-Bu)3 (0.30 mM) dissolved in toluene. Mix and heat in glove box in mantle at 80° C. under nitrogen for 1 hr. Solution immediately is dark purple but on reaching ~80° C. it is dark red brown with slight green luminescence. Cool and work up by removing from glove box and filter through a basic alumina plug eluting with toluene and chloroform. Product is yellow and poorly soluble. The green luminescent material elutes from a soxhlet extraction using toluene and basic alumina as a deep yellow solution. Evaporate to low volume and add methanol to ppt an orange solid with yellowgreen PL in ~0.5 g yield. TLC shows single green spot running at the solvent front in toluene. Material is very poorly soluble in toluene

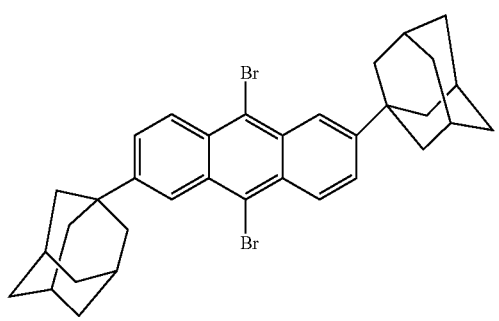

C$_{34}$H$_{36}$Br$_2$
Exact Mass: 602.12
Mol. Wt.: 604.46
C, 67.56; H, 6.00; Br, 26.44

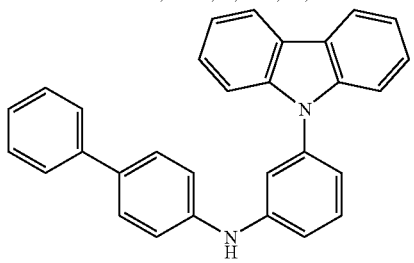

C$_{30}$H$_{22}$N$_2$
Exact Mass: 410.18
Mol. Wt.: 410.51
C, 87.77; H, 5.40; N, 6.82

Product:

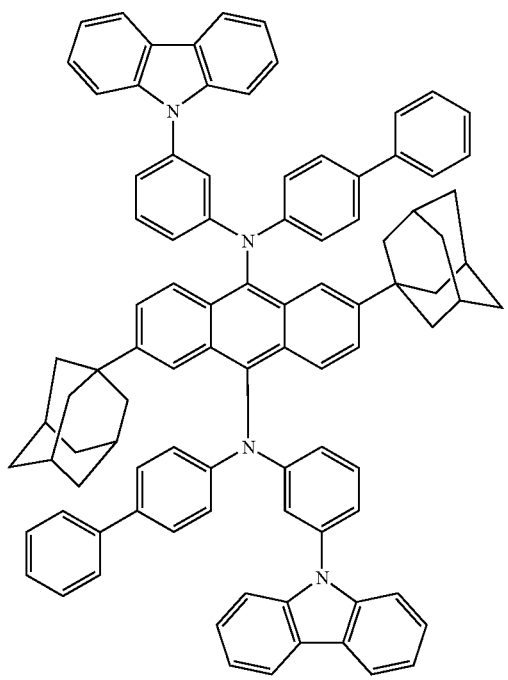

C$_{94}$H$_{78}$N$_4$
Exact Mass: 1262.62
Mol. Wt.: 1263.65
C, 89.34; H, 6.22; N, 4.43

Collect the orange solid and re-chromatograph on silica eluting with 10% DCM in hexanes to elute a series of bright blue bands ahead of an orange yellow band with green PL. Rechromatograph on florisil* using 10% DCM yielding only 0.35 g yellow orange solid. Sent for NMR in dichloromethane as a bright green PL solution. The NMR shows no hindered rotation of the amine groups and there appears to be a little of the 2,7-diadamantyl isomer present.

Example 6

This Example demonstrates the fabrication and performance of a device having green emission. The following materials were used:

anode=Indium Tin Oxide (50 nm)

buffer layer=Buffer 1 (50 nm), which is an aqueous dispersion of an electrically conductive polymer and a polymeric fluorinated sulfonic acid. Such materials have been described in, for example, published U.S. patent applications US 2004/0102577, US 2004/0127637, and US 2005/0205860.

hole transport layer=HT-1, a bi-naphthalene polymer (20 nm)

photoactive layer=host H1 and dopant (60 nm). The dopant and ratios are given in the table.

electron transport layer=a metal quinolate derivative (10 nm)

cathode=CsF/Al (0.7/100 nm)

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of Buffer 1 was spin-coated over the ITO surface and heated to remove solvent. After cooling, the substrates were then spin-coated with a solution of a hole transport material, and then heated to remove solvent. After cooling the substrates were spin-coated with the emissive layer solution, and heated to remove solvent. The substrates were masked and placed in a vacuum chamber. A ZrQ layer was deposited by thermal evaporation, followed by a layer of LiF. Masks were then changed in vacuo and a layer of Al was deposited by thermal evaporation. The chamber was vented, and the devices were encapsulated using a glass lid, dessicant, and UV curable epoxy.

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W. The results are given in Table 1.

TABLE 1

Device results

| Ex. | Dopant | Ratio | cd/A | EQE (%) | PE (lm/W) | Color (x, y) | T50 |
|---|---|---|---|---|---|---|---|
| 6-1 | E1 | 13:1 | 24.5 | 7.3 | 18.9 | (0.226, 0.633) | 199,551 |
| 6-2 | E1 | 5:1 | 24.2 | 7.0 | 19.1 | (0.243, 0.647) | 185,609 |
| 6-3 | E3 | 13:1 | 22.2 | 6.5 | 17.0 | (0232, 0.637) | 178,272 |

Ratio = weight ratio of host to dopant; CE = current efficiency; EQE = external quantum efficiency; PE = power efficiency; CIEx and CIEy are the x and y color coordinates according to the C.I.E. chromaticity scale (Commission Internationale de L'Eclairage, 1931); T50 is the time in hours to reach 50% of initial luminance (from an initial luminance of 1000 cd/m2).

Example 7

This example demonstrates the fabrication and performance of a device having a different architecture.

The devices were prepared as described in Example 6, except that an additional layer was formed prior to deposition of the electron transport layer. This layer was formed by vapor deposition of a 6:1 ratio of H1 and the chrysene derivative shown below:

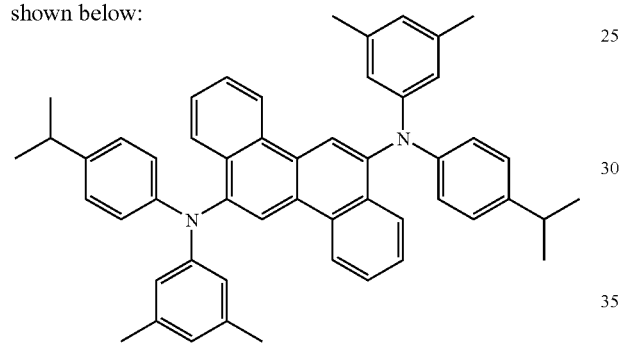

The results are given below in Table 2.

TABLE 2

Device results

| Ex. | Dopant | Ratio | cd/A | EQE (%) | PE (lm/W) | Color (x, y) | T50 |
|---|---|---|---|---|---|---|---|
| 7-1 | E1 | 13:1 | 22.4 | 7.0 | 16.6 | (0.222, 0.594) | 365237 |
| 7-2 | E4 | 13:1 | 23.3 | 7.1 | 17.4 | (0234, 0.607) | 215039 |

Ratio = weight ratio of host to dopant; CE = current efficiency; EQE = external quantum efficiency; PE = power efficiency; CIEx and CIEy are the x and y color coordinates according to the C.I.E. chromaticity scale (Commission Internationale de L'Eclairage, 1931); T50 is the time in hours to reach 50% of initial luminance (from an initial luminance of 1000 cd/m2).

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. A compound having Formula I:

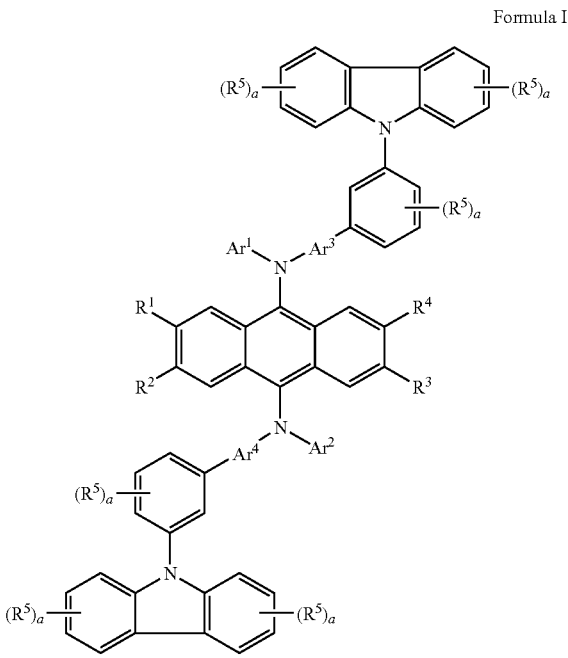

Formula I wherein:

$Ar^1$ and $Ar^2$ are the same or different and are aryl;

$Ar^3$ and $Ar^4$ are the same or different and are selected from the group consisting of a single bond and arylene; and $R^1$ through $R^4$ are the same or different and are selected from the group consisting of H, D, alkyl, and alkoxy;

$R^5$ is the same or different at each occurrence and is selected from the group consisting of D, alkyl, aryl and alkoxy;

a is the same or different at each occurrence and is an integer from 0-4.

2. The compound of claim 1, wherein $R^1$=$R^3$ and $R^2$=$R^4$.

3. The compound of claim 1, wherein $R^1$ and $R^3$ are selected from branched alkyls and cycloalkyls having 5-15 carbon atoms.

4. The compound of claim 3, wherein $R^2$ and $R^4$ are H.

5. The compound of claim 1, wherein $Ar^1$ and $Ar^2$ are selected from the group consisting of naphthyl, naphthylphenyl, phenylnaphthyl and a group having Formula II:

Formula II

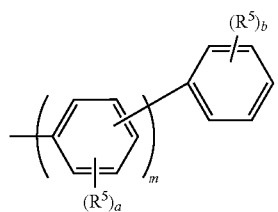

where:

- $R^5$ is the same or different at each occurrence and is selected from the group consisting of D, alkyl, alkoxy, and aryl;
- a is the same or different at each occurrence and is an integer from 0-4;
- b is the same or different at each occurrence and is an integer from 0-5; and
- m is the same or different at each occurrence and is an integer from 0 to 6.

6. The compound of claim 1, wherein $Ar^3$ and $Ar^4$ are selected from the group consisting of a single bond, naphthylene, naphthylphenylene, phenylnaphthylene, and a group having Formula III:

Formula III

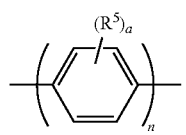

where:

- $R^5$ is the same or different at each occurrence and is selected from the group consisting of D, alkyl, alkoxy, and aryl;
- a is the same or different at each occurrence and is an integer from 0-4; and
- n is the same or different at each occurrence and is an integer from 0 to 6.

7. A compound selected from the group consisting of E1, E2, E3, E4 and E5

Compound E1:

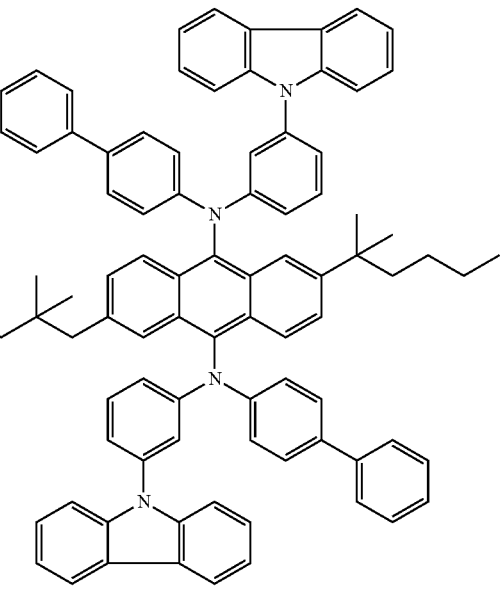

Compound E2 (isomeric mixture):

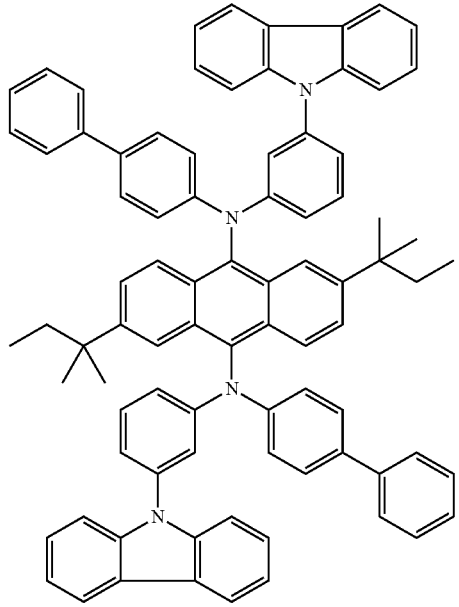

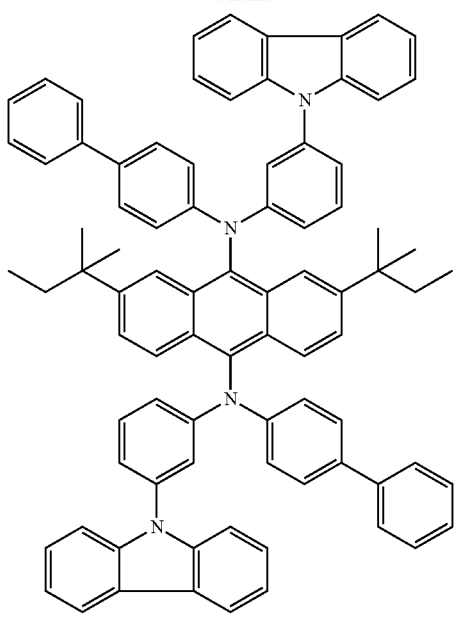
Compound E3:
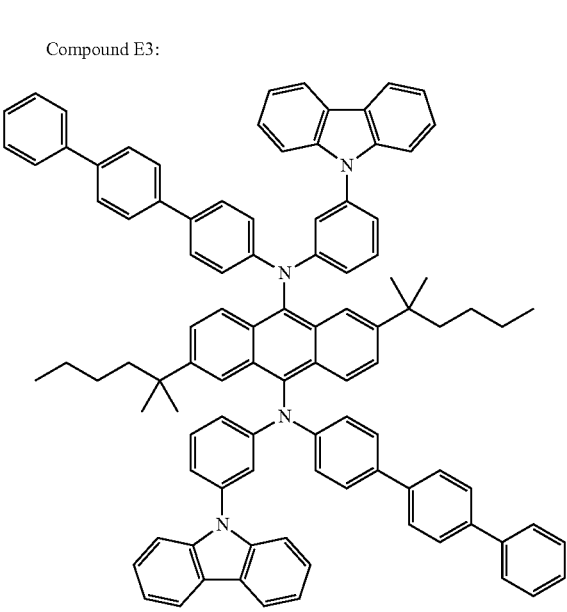
C₁₀₀H₈₆N₄
Exact Mass: 1342.69
Mol. Wt.: 1343.78
C, 89.38; H, 6.45; N, 4.17
Compound E4:
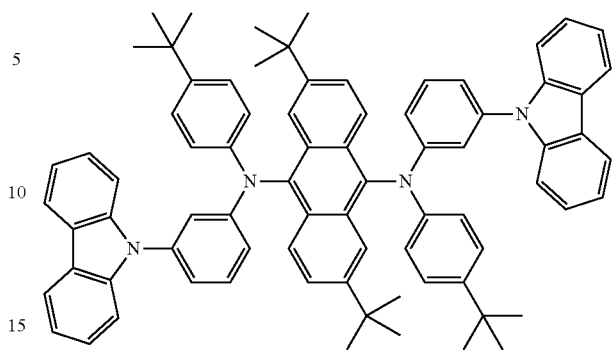
C₇₈H₇₄N₄
Exact Mass: 1066.59
Mol. Wt.: 1067.45
C, 87.76; H, 6.99; N, 5.25
Compound E5
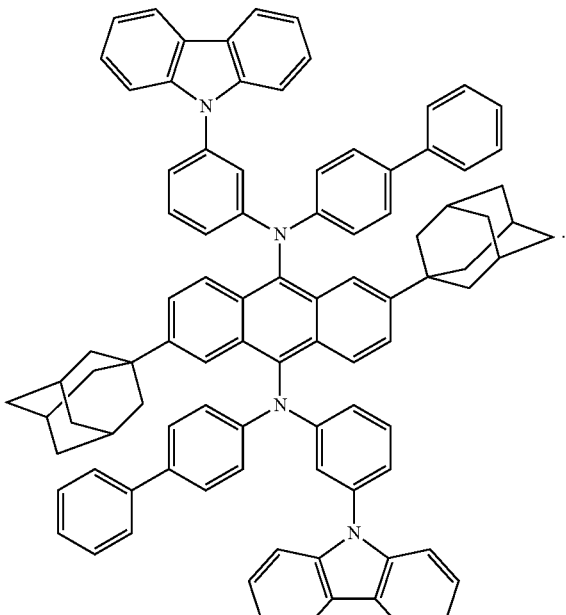
C₉₄H₇₈N₄
Exact Mass: 1262.62
Mol. Wt.: 1263.65
C, 89.34; H, 6.22; N, 4.43

8. An organic electronic device comprising a first electrical contact layer, a second electrical contact layer, and at least one active layer therebetween, wherein the active layer comprises a compound having Formula I:

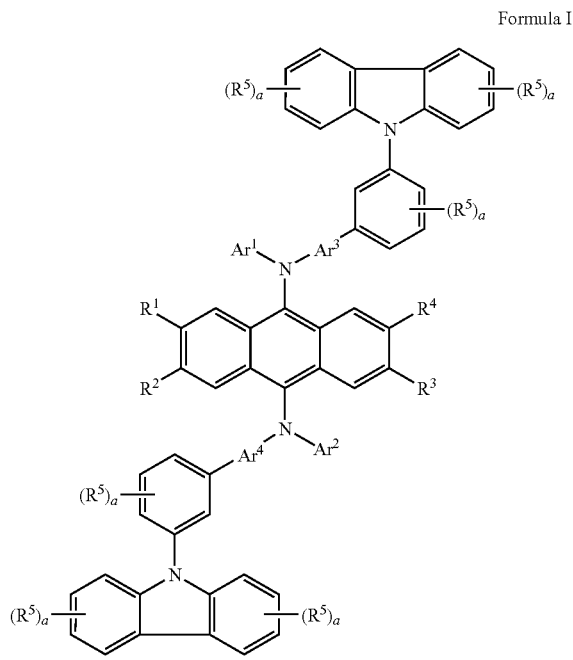

Formula I wherein:

$Ar^1$ and $Ar^2$ are the same or different and are aryl;

$Ar^3$ and $Ar^4$ are the same or different and are selected from the group consisting of a single bond and arylene; and $R^1$ through $R^4$ are the same or different and are selected from the group consisting of H, D, alkyl, and alkoxy;

$R^5$ is the same or different at each occurrence and is selected from the group consisting of D, alkyl, aryl and alkoxy;

a is the same or different at each occurrence and is an integer from 0-4.

9. The device of claim 8, wherein $R^1$=$R^3$ and $R^2$=$R^4$.

10. The device of claim 8, wherein $R^1$ and $R^3$ are selected from branched alkyls and cycloalkyls having 5-15 carbon atoms.

11. The device of claim 10, wherein $R^2$ and $R^4$ are H.

12. The device of claim 8, wherein $Ar^1$ and $Ar^2$ are selected from the group consisting of naphthyl, naphthylphenyl, phenylnaphthyl and Formula II:

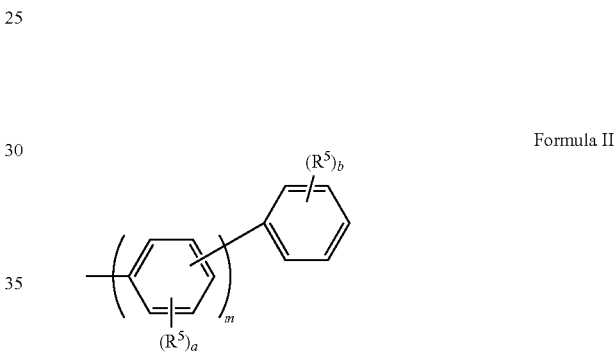

Formula II where:

$R^5$ is the same or different at each occurrence and is selected from the group consisting of D, alkyl, alkoxy, and aryl;

a is the same or different at each occurrence and is an integer from 0-4;

b is the same or different at each occurrence and is an integer from 0-5; and m is the same or different at each occurrence and is an integer from 0 to 6.

13. The device of claim 8, wherein $Ar^3$ and $Ar^4$ are selected from the group consisting of a single bond, naphthylene, naphthylphenylene, phenylnaphthylene, and Formula III:

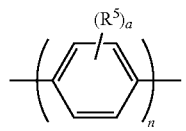

Formula III where:

$R^5$ is the same or different at each occurrence and is selected from the group consisting of D, alkyl, alkoxy, and aryl;

a is the same or different at each occurrence and is an integer from 0-4; and n is the same or different at each occurrence and is an integer from 1 to 6.

14. The device of claim 8, wherein the compound is selected from the group consisting of E1, E2, E3, E4 and E5

Compound E1:

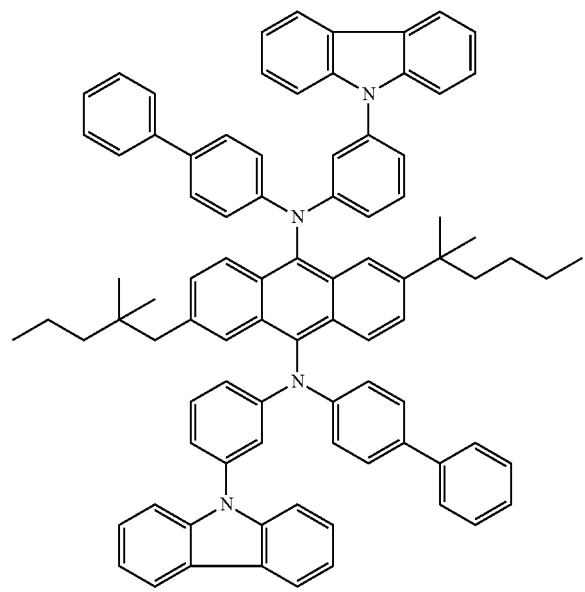

-continued

Compound E2 (isomeric mixture):

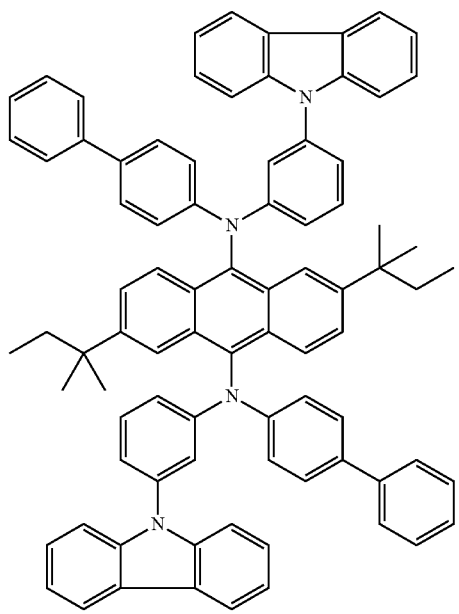

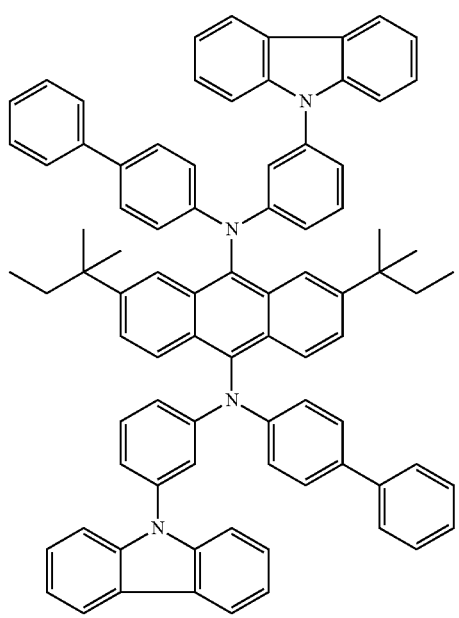

-continued

Compound E3:

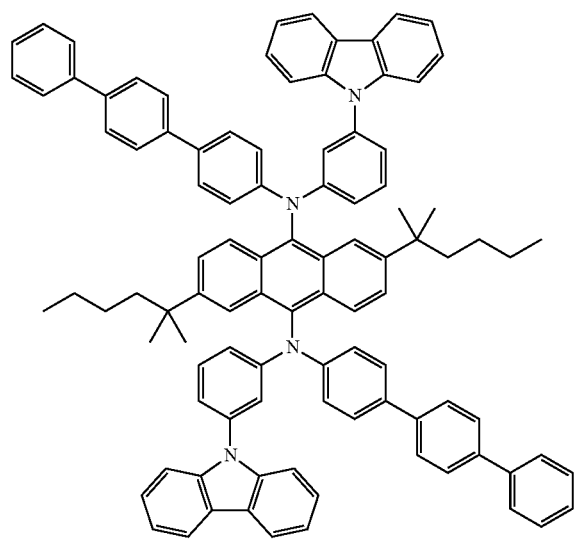

C<sub>100</sub>H<sub>86</sub>N<sub>4</sub>
Exact Mass: 1342.69
Mol. Wt.: 1343.78
C, 89.38; H, 6.45; N, 4.17

Compound E4:

C$_{78}$H$_{74}$N$_4$
Exact Mass: 1066.59
Mol. Wt.: 1067.45
C, 87.76; H, 6.99; N, 5.25

-continued

Compound E5

C$_{94}$H$_{78}$N$_4$
Exact Mass: 1262.62
Mol. Wt.: 1263.65
C, 89.34; H, 6.22; N, 4.43

15. The device of claim 8, wherein the active layer is a photoactive layer and further comprises a host material.

16. The device of claim 15, further comprising a buffer layer between the first electrical contact layer and the active layer.

17. The device of claim 16, wherein the buffer layer comprises at least one electrically conductive polymer and at least one fluorinated acid polymer.

* * * * *